(12) United States Patent
Kande et al.

(10) Patent No.: US 10,354,951 B1
(45) Date of Patent: Jul. 16, 2019

(54) THIN FILM RESISTOR WITH PUNCH-THROUGH VIAS

(71) Applicant: Texas Instruments Incorporated, Dallas, TX (US)

(72) Inventors: Dhishan Kande, Dallas, TX (US); Qi-Zhong Hong, Richardson, TX (US); Abbas Ali, Plano, TX (US); Gregory B. Shinn, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/872,429

(22) Filed: Jan. 16, 2018

(51) Int. Cl.
*H01L 21/768* (2006.01)
*H01L 23/522* (2006.01)
*H01L 49/02* (2006.01)
*H01L 23/532* (2006.01)

(52) U.S. Cl.
CPC .... *H01L 23/5228* (2013.01); *H01L 21/76805* (2013.01); *H01L 23/5226* (2013.01); *H01L 28/24* (2013.01); *H01L 23/53223* (2013.01); *H01L 23/53238* (2013.01); *H01L 23/53266* (2013.01)

(58) Field of Classification Search
CPC ..... H01L 27/11; H01L 27/0802; H01L 23/62; H01L 21/76877; H01L 21/76843; H01L 23/5283; H01L 23/5228
USPC ......... 438/171, 190, 210; 257/537, 687, 536
See application file for complete search history.

(56) References Cited

U.S. PATENT DOCUMENTS

| | | | |
|---|---|---|---|
| 7,332,403 B1* | 2/2008 | Hill | H01L 28/20 257/E27.047 |
| 7,416,951 B2* | 8/2008 | Beach | H01L 23/5228 257/E21.004 |
| 8,013,394 B2* | 9/2011 | Chinthakindi | H01L 21/76895 257/358 |
| 2002/0117743 A1* | 8/2002 | Nakatani | H01L 21/4857 257/687 |
| 2007/0069334 A1* | 3/2007 | Beach | H01L 23/5228 257/536 |
| 2008/0237800 A1* | 10/2008 | Chinthakindi | H01L 21/76895 257/537 |

* cited by examiner

*Primary Examiner* — Thinh T Nguyen
(74) *Attorney, Agent, or Firm* — Tuenlap Chan; Charles A. Brill; Frank D. Cimino

(57) ABSTRACT

A device including a thin film resistor (TFR) structure. The TFR structure is accessible by one or more conductive vias that extend vertically from an upper metal layer to completely penetrate a TFR layer positioned thereunder. The conductive vias are coupled to one or more sidewalls of the TFR layer at or near the sites of penetration. The TFR structure can be manufactured by a method that includes etching a via trench completely through the TFR layer and a dielectric layer above the TFR layer, and filling the via trench with a conductor coupled to a sidewall of the TFR layer.

7 Claims, 10 Drawing Sheets

THIN FILM RESISTOR WITH PUNCH-THROUGH VIAS

BACKGROUND

Thin film transistors (TFRs) offer low temperature coefficient of resistance (TCR) and low mismatch and have many applications. For example, high precision analog circuits (e.g., voltage references, digital to analog converters) may include one or more TFRs because of the low TCR. Due to process variations, the actual resistance of a TFR may deviate from its target resistance. Such a deviation becomes even more susceptible to process variations as the thickness of a TFR reduces. In high precision analog applications where ultra-thin (e.g., less than 100 Å) TFRs are adopted, even a small amount of resistance deviation may cause mismatch issues.

SUMMARY

The present disclosure discovers one or more process variations during the formation of conductive vias that are coupled to a thin film resistor (TFR) layer. The discovered process variations may contribute to deviations of the actual resistance of the TFR layer from its target resistance. To address these deviations, the present disclosure introduces methods and apparatus for minimizing the process variations during the formation of conductive vias that are coupled to one or more TFR layers.

In one implementation, for example, the present disclosure introduces a method that includes forming a thin film resistor (TFR) layer above a substrate, forming a dielectric layer above the TFR layer, etching a via completely through the dielectric layer and the TFR layer, and filling the via with a conductor coupled to a sidewall of the TFR layer.

In another implementation, for example, the present disclosure introduces a method that includes forming a first thin film resistor (TFR) layer above a substrate, forming a first dielectric layer above the first TFR layer, forming a second TFR layer above the first dielectric layer, forming a second dielectric layer above the second TFR layer, forming a first conductive via completely through the first and second dielectric layers and completely through a first terminal region of the first TFR layer, and forming a second conductive via completely through the second dielectric layer and completely through a second terminal region of the second TFR layer.

In yet another implementation, for example, the present disclosure introduces a device that includes a substrate, a thin film resistor (TFR) layer, a dielectric layer, and a conductive via. The TFR layer is positioned above the substrate, and the dielectric layer is positioned above the TFR layer. The conductive via completely penetrates through the dielectric layer and completely through the TFR layer. Moreover, the conductive via coupled to a sidewall of the TFR layer.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
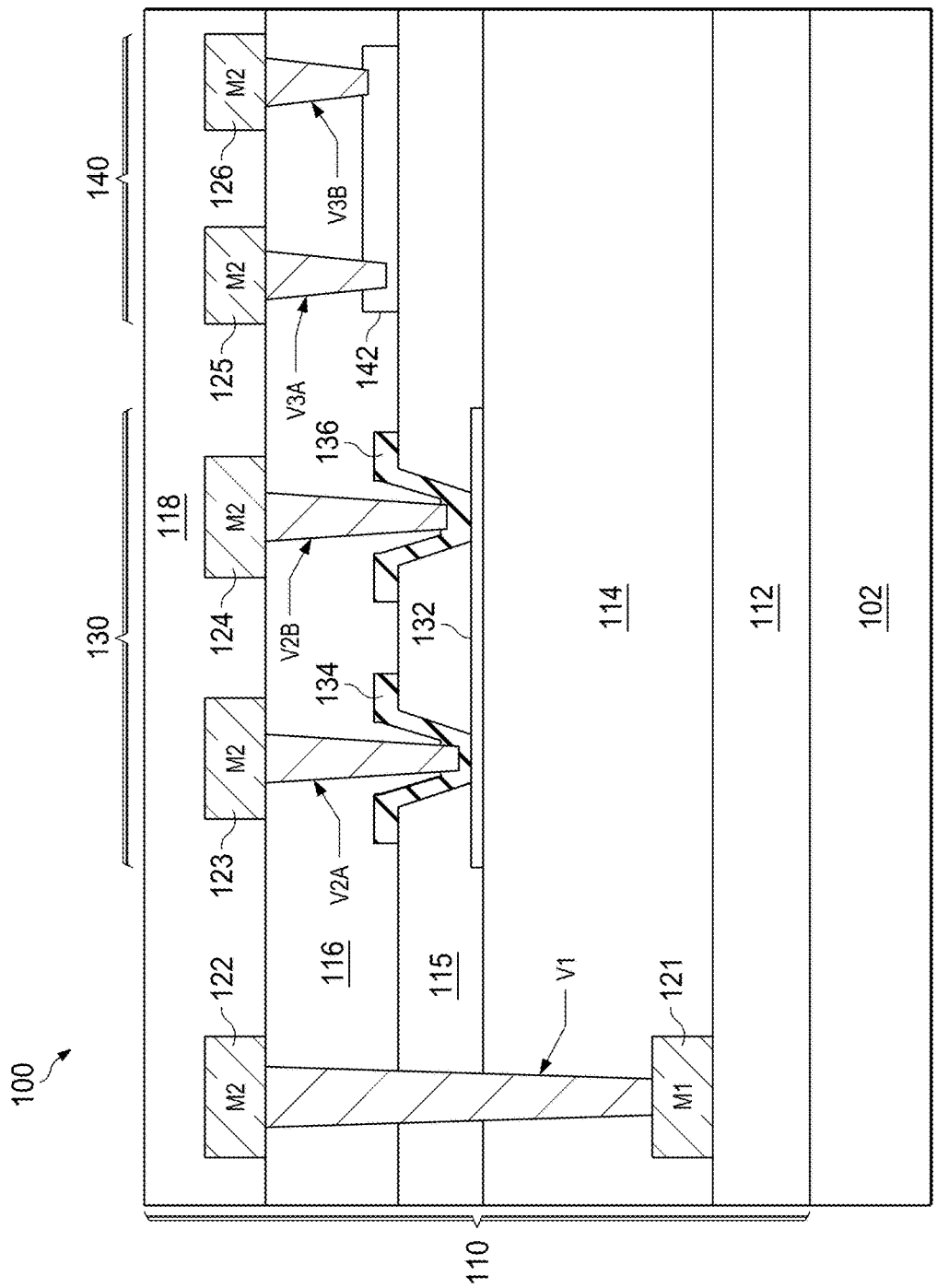
FIG. 1 shows a cross-sectional view of a device having multiple thin film resistor (TFR) structures.

FIG. 1 shows a cross-sectional view of a device 100 having multiple thin film resistor (TFR) structures. The device 100 may be a semiconductor device, such as an integrated circuit with one or more analog circuits. The device 100 includes a semiconductor substrate 102 and a stack of dielectric layers 110 on the semiconductor substrate 102. The stack of dielectric layers 110 can be formed by sequential depositions of a first dielectric layer 112, a second dielectric layer 114 on the first dielectric layer 112, a third dielectric layer 115 on the second dielectric layer 114, a fourth dielectric layer 116 on the third dielectric layer 115, and a fifth dielectric layer 118 on the fourth dielectric layer 116.

The device 100 includes one or more metal layers for accessing transistor regions in the substrate 102 and/or electronic components positioned above the substrate 102. In one implement, for example, the device 100 may include a first metal layer 121 and a second metal layer 122, 123, 124, 125, and 126. The first metal layer 121 is positioned between the first and second dielectric layers 112 and 114, whereas the second metal layer 122, 123, 124, 125, and 126 is positioned between the fourth and fifth dielectric layers 116 and 118.

The device 100 also includes one or more TFR structures, such as a first TFR structure 130 and a second TFR structure 140. The first TFR structure 130 includes a first TFR layer 132 positioned between the second and third dielectric layers 114 and 115. The second TFR structure 140 structure includes a second TFR layer 142 positioned between the third and fourth dielectric layers 115 and 116. In general, a TFR layer may have a thickness less than 0.5 μm. For instance, the first TFR layer 132 may have a thickness less than 100 Å, and the second TFR layer 142 may have a thickness ranges between 100 Å and 500 Å. Due to its relatively small thickness, a TFR layer typically has high sheet resistance (e.g., 100-1000 Ω/sq.) and a near-zero temperature coefficient of resistance (TCR) with very low mismatch (e.g., less than 5000 ppm-um mismatch).

Each of the first and second TFR layers 132 and 142 can be accessed by an upper metal layer using one or more conductive vias. For instance, the first TFR layer 132 is coupled to the second metal layers 123 and 124 by a first conductive via V2A and a second conductive via V2B respectively. Likewise, the second TFR layer 142 is coupled to the second metal layers 125 and 126 by a first conductive via V3A and a second conductive via V3B. Because the second TFR layer 142 is relatively thick, the first and second vias V3A and V3B may be etched into a top surface of the TFR layer 142 to make ohmic contacts. By contrast, the first TFR layer 132 is relatively thin, such that a first landing pad (e.g., a titanium nitride (TiN) or silicon chromium (SiCr) material) and a second landing pad (e.g., a TiN or SiCr material) may be used for receiving the first and second conductive vias V2A and V2B and for establishing ohmic contacts.

The first and second TFR layers 132 and 142 are both positioned between the first and second metal layers 121 and 122. As such, the conductive vias V2A, V2B, V3A, and V3B are formed together with the conductive via V1 that couples the first metal layer 121 to the second metal layer 122. These conductive vias have at least three different depths, with the conductive via V1 being the deepest, the first and second conductive vias V2A and V2B being the second deepest, and the first and second conductive vias V3A and V3B being the least deep. The process for forming conductive vias with three or more depths can be challenging in that the etching of via trenches may incur a certain amount of imprecision. Such an imprecision may in turn deviate the actual resistance of the first and second TFR structures 130 and 140 from their respective target resistance.

Referring to the first TFR structure 130, for example, the first conductive via V2A extends deeper and farther into the first landing pad 134 than the second conductive via V2B extending into the second landing pad 136. Any such difference in penetration may result in a mismatch of head resistance (or terminal resistance) on both ends of the first TFR layer 132. If the head resistance mismatch is significant (e.g., greater than 10% of total mismatch), the actual resistance of the first TFR structure 130 may become inaccurate for its intended application.

Moreover, referring to the second TFR structure 140, for example, the first conductive via V3A extends deeper and farther into the second TFR layer 142 than the second conductive via V3B. Again, any such difference in penetration may result in a mismatch of head resistance (or terminal resistance) on both ends of the second TFR layer 142. If the head resistance mismatch is significant (e.g., greater than 10% of total mismatch), the actual resistance of the second TFR structure 140 may become inaccurate for its intended application.

The present disclosure introduces a solution to minimize the variability of the head resistance attributable to process variations during the fabrication of one or more TFR structures. The disclosed solution also provides additional process efficiency when compared to the conventional process for fabricating TFR structures (e.g., the first and second TFR structures 130 and 140). In one implementation, for example, the disclosed solution includes a conductive via that completely penetrates a TFR layer and makes ohmic contacts with a sidewall of the TFR layer at or near the sites of penetration. The sidewall coupling between the conductive via and the TFR layer is more uniform and less susceptible to process variations (e.g., difference in depths between a pair of conductive vias for accessing a TFR layer) than top surface couplings as adopted by the first and second TFR structures 130 and 140.

Figure 2A:
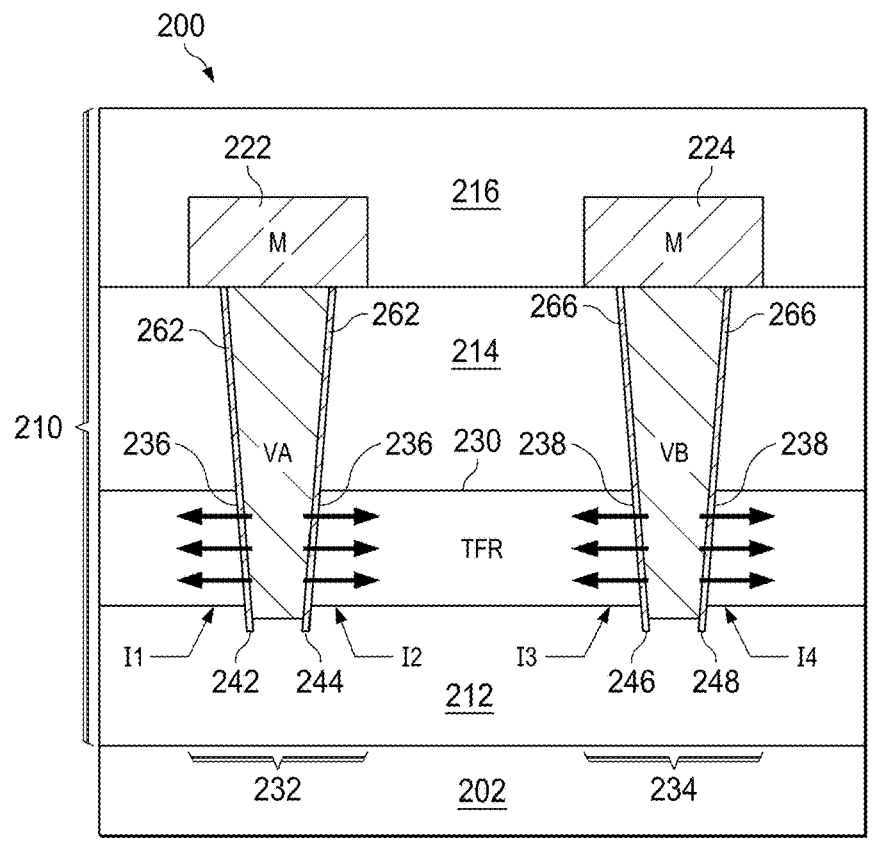
FIGS. 2A-2B show cross-sectional view of a TFR structure with punch-through vias according to an aspect of the present disclosure.
Figure 2B:
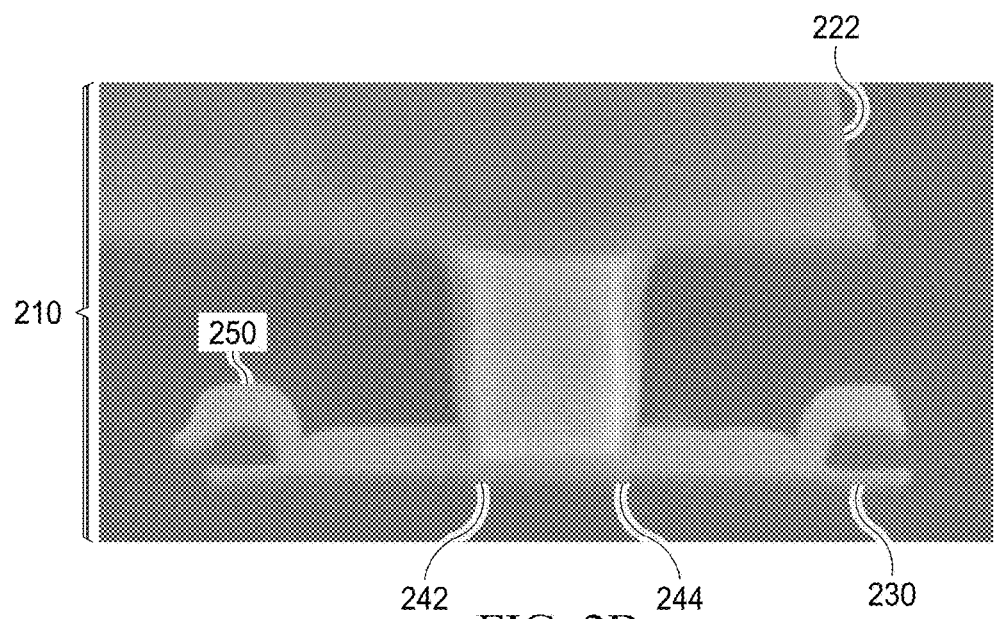

Referring to FIG. 2A, a TFR structure 200 with punch-through vias VA and VB are shown according to an aspect of the present disclosure. For a more realistic and detail illustration, FIG. 2B shows a high resolution Scanning Electron Microscope (SEM) image of a partial cross-sectional view of the TFR structure 200. The TFR structure 200 may be a discrete component or a part of an electronic device, such as the device 100, that includes a semiconductor substrate 202 and a stack of dielectric layers 210.

The TFR structure 200 includes a TFR layer 230 positioned above the substrate 202 and in between a first dielectric layer 212 and a second dielectric layer 214. The TFR layer 230 can be a thin resistive layer (e.g., less than 0.5 μm) having a relatively large sheet resistance (e.g., 100-1000 Ω/sq). In one implementation, for example, the TFR layer 230 may include a silicon chromium (SiCr) based intermetallic mixture with an example composition (in relative atomic %) of $Si_xCr_yC_zO_w$, where x and y can range from 5% to 50%, whereas z and w can range from 0% to 50%. In another implementation, for example, the TFR layer 230 may include a nickel chromium (NiCr) based intermetallic mixture with an example composition (in relative atomic %) of $Ni_xCr_yC_zO_w$, where x and y can range from 5% to 50%, whereas z and w can range from 0% to 50%. In yet another implementation, for example, the TFR layer 230 may include a polysilicon material.

The TFR layer 230 has a first terminal region 232 positioned near a first end and a second terminal region 234 positioned near a second end opposite to the first end. The distance between the first and second terminal regions 232 and 234 defines a body resistance of the TFR layer 230. The TFR structure 200 includes first and second upper metal layers 222 and 224 that vertically aligns with the first and second terminal regions 232 and 234 respectively. The first and second upper metal layers 222 and 224 are positioned between the second dielectric layer 214 and the third dielectric layer 216.

The TFR structure 200 further includes first and second punch-through vias VA and VB for providing a conductive path between the first and second upper metal layers 222 and 224 and through the TFR layer 230. The first and second punch-though vias VA and VB are conductive in nature, and they may include a conductive material such as tungsten, aluminum, and/or copper. The first and second punch-through vias VA and VB each completely penetrates through the dielectric layer (e.g., the second dielectric layer 214) between the TFR layer 230 and the upper metal layers 222 and 224. Moreover, the first and second punch-through vias VA and VB each completely penetrates through the TFR layer 230, such that the punch-through vias VA and VB are coupled to first and second sidewalls 236 and 238 of the TFR layer 230 at or near the sites of penetration.

The first punch-through via VA is a first conductive via that completely penetrates through the first terminal region 232. A first barrier layer 262 may be deposited between the conductive material of the first punch-through via VA and the first sidewall 236 of the penetrated TFR layer 230 to enhance the ohmic contact and adhesion therebetween. In one implementation, for example, the first barrier layer 262 may include a titanium (Ti) layer followed by a titanium nitride (TiN) material. In another implementation, for example, the first barrier layer 262 may be omitted. The first punch-through via VA may extend below the first terminal region 232 of the TFR layer 230 and includes first and second spikes 242 and 244 protruding from a bottom surface of the TFR layer 230. Alternatively, the first punch-through via VA may stop extending and level with the bottom surface of the TFR layer 230.

In a similar fashion, the second punch-through via VB is a second conductive via that completely penetrates through the second terminal region 234. A second barrier layer 266 may be deposited between the conductive material of the second punch-through via VB and the second sidewall 238 of the penetrated TFR layer 230 to enhance the ohmic contact and adhesion therebetween. In one implementation, for example, the second barrier layer 266 may include a titanium (Ti) layer followed by a titanium nitride (TiN) material. In another implementation, for example, the second barrier layer 266 may be omitted. The second punch-through via VB may extend below the second terminal region 234 of the TFR layer 230 and includes first and second spikes 246 and 248 protruding from a bottom surface of the TFR layer 230. Alternatively, the second punch-through via VB may stop extending and level with the bottom surface of the TFR layer 230.

Referring to FIG. 2B, a landing pad 250 may be used to position and align the etch site for forming the first punch-through via VA. In this particular process configuration, the first punch-though via VA also completely penetrates through the landing pad 250 before penetrating the TFR layer 230. In other implementations, the landing pad 250 may be omitted altogether.

The TFR structure 200 with the punch-through vias VA and VB offers multiple advantages over conventional TFR structures. From a structural standpoint, the contacts between the punch-through vias VA and VB and the TFR layer 230 are along the sidewalls 236 and 238 at or near the sites of penetration. The resistivity of these sidewall contacts are rather uniform and independent of the respective depths of the punch-through vias VA and VB. As such, the punch-through vias VA and VB may facilitate uniform current flow (e.g., $I_1$, $I_2$, $I_3$, and $I_4$) across the periphery of the sidewall contacts. The uniform current flow may be attributable to the relatively precise resistance in the terminal regions (e.g., 232 and 234). Advantageously, the TFR structure 200 offers precise resistance for high precision analog applications, and it is less sensitive to process variations than the TFR structures 130 and 140 as shown and described in FIG. 1.

And from a process standpoint, the fabrication of the TFR structure 200 is more flexible and takes less process steps. Such a flexible and simplified fabrication process (see, infra, at descriptions of FIG. 6-7) allows multiple TFR layers to be positioned at different depths from a top surface of a device and be connected during the Back End of Line (BEL) process without requiring a via trench etch process to be selective to one or more resistive materials. Advantageously, multiple via trenches of varying depths can be etched: (1) without the assistance of any landing pad, (2) during a single etch process, and (3) within a single etch time period.

Although the technique of forming punch-through vias are applied to connecting one or more TFR layers as described herein, such a technique may also be applied to connecting other types of conductive layer within a semiconductor device. In one implementation, for example, punch-through vias may be used for interconnecting multi-level metal layers and/or polysilicon layers.

Figure 3:
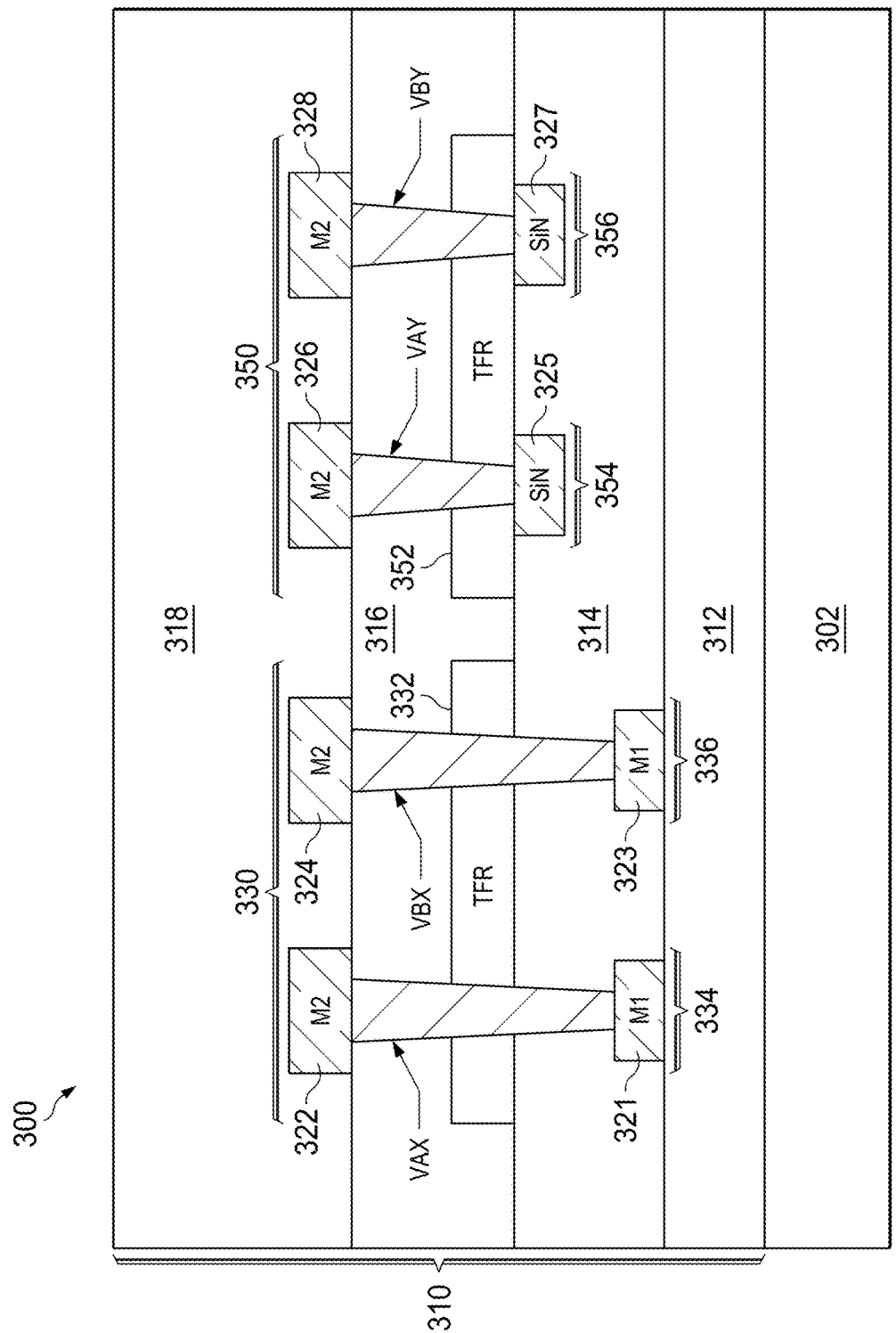
FIG. 3 shows a cross-sectional view of a device having multiple TFR structures with punch-through vias reaching etch-stop layers according to an aspect of the present disclosure.

The TFR structure 200 can be configured, arranged, and modified in many ways. The following descriptions provide a few example implementations of the TFR structure 200 and processes for manufacturing the same. As shown in FIG. 3, for example, a device 300 includes first and second TFR structures 330 and 350, each with punch-through vias (e.g., VAX, VBX, VBX, and VBY) reaching etch-stop layers (e.g., 334, 336, 352, 354) according to an aspect of the present disclosure. The device 300 includes a semiconductor substrate 302 and a stack of dielectric layers 310 on the semiconductor substrate 302. The stack of dielectric layers 310 can be formed by sequential depositions of a first dielectric layer 312, a second dielectric layer 314 on the first dielectric layer 312, a third dielectric layer 316 on the second dielectric layer 314, and a fourth dielectric layer 318 on the third dielectric layer 316.

The first and second TFR structures 330 and 350 are each positioned above the semiconductor substrate 302 and within the stack of dielectric layers 310. Each of the first and second TFR structures 330 and 350 includes structural features of the TFR structure 200. For the sake of conciseness, some of these features are not shown or described again in FIG. 3 though it is understood that the first and second TFR structures 330 and 350 may nevertheless incorporate these features.

The first TFR structure 330 includes a first TFR layer 332 that is positioned between the second and third dielectric layer 314 and 316. The first TFR layer 332 has similar characteristics as the TFR layer 230 as shown and described in FIG. 2A. The first TFR layer 332 has a first terminal region 334 and a second terminal region 336. The distance between the first and second terminal regions 334 and 336 defines the body resistance accessible from the TFR layer 332. The first TFR structure 330 includes upper metal layers 322 and 324 for accessing the first TFR layer 332. The first TFR structure 330 includes first and second punch-through (conductive) vias VAX and VBX, extending from the upper metal layers 322 and 324 to penetrate completely through the first TFR layer 332.

In particular, the first punch-through via VAX penetrates the first terminal region 334 of the first TFR layer 332 and protrudes from a bottom surface of the first TFR layer 332. Likewise, the second punch-through via VAX penetrates the second terminal region 336 of the first TFR layer 332 and protrudes from the bottom surface of the first TFR layer 332. The first and second punch-through vias VAX and VBX are coupled to sidewalls of the first TFR layer 332 at or near the sites of penetration. Depending on the process flow, a barrier layer (see, e.g., 262 at FIG. 2A) may be deposited between each of the first and second punch-through vias VAX and VBX and the respective sidewall of the first TFR layer 332.

As a modification from the TFR structure 200, the first TFR structure 330 includes an etch stop layer under the first TFR layer 332. In one implementation, the etch stop layer may include first and second lower metal layers 321 and 323, both of which are positioned between the second and third dielectric layer 312 and 314. Vertically aligned with the first and second terminal regions 334 and 336, the lower metal layers 321 and 323 may serve as a landing layer for receiving the first and second punch-through vias VAX and VBX respectively. Depending on the etch time for etching the punch-through via trenches, the first and second punch-through vias VAX and VBX may reach the first and second lower metal layers 321 and 323 without completely penetrating them.

The second TFR structure 350 includes a second TFR layer 352 that is positioned between the second and third dielectric layer 314 and 316. The second TFR layer 352 has similar characteristics as the TFR layer 230 as shown and described in FIG. 2A. The second TFR layer 352 has a first terminal region 354 and a second terminal region 356. The distance between the first and second terminal regions 354 and 356 defines the body resistance accessible from the TFR layer 352. The second TFR structure 350 includes upper metal layers 326 and 328 for accessing the second TFR layer 352. The second TFR structure 350 includes first and second punch-through (conductive) vias VAY and VBY, extending from the upper metal layers 326 and 328 to penetrate completely through the second TFR layer 352.

In particular, the first punch-through via VAY penetrates the first terminal region 354 of the second TFR layer 354 and protrudes from a bottom surface of the second TFR layer 352. Likewise, the second punch-through via VBY penetrates the second terminal region 356 of the second TFR layer 354 and protrudes from the bottom surface of the second TFR layer 352. The first and second punch-through vias VAY and VBY are coupled to sidewalls of the first TFR layer 352 at or near the sites of penetration. Depending on the process flow, a barrier layer (see, e.g., 266 at FIG. 2A) may be deposited between each of the first and second punch-through vias VAY and VBY and the respective sidewall of the second TFR layer 352.

As a modification from the TFR structure 200, the second TFR structure 350 includes an etch stop layer under the second TFR layer 352. In one implementation, the etch stop layer may include first and second silicon nitride (SiN) layers 325 and 327, both of which are positioned between the third and fourth dielectric layer 314 and 316. The first and second SiN layers 325 and 327 may be positioned directly under the second TFR layer 352. Also the first and second SiN layers 325 and 327 may be positioned above the lower metal layers 321 and 323. Vertically aligned with the first and second terminal regions 354 and 356, the SiN layers 325 and 327 may serve as a landing layer for receiving the first and second punch-through vias VAY and VBY respectively. Depending on the etch time for etching the punch-through via trenches, the first and second punch-through vias VAY and VBY may reach the first and second SiN layers 325 and 327 without completely penetrating them.

Figure 4:
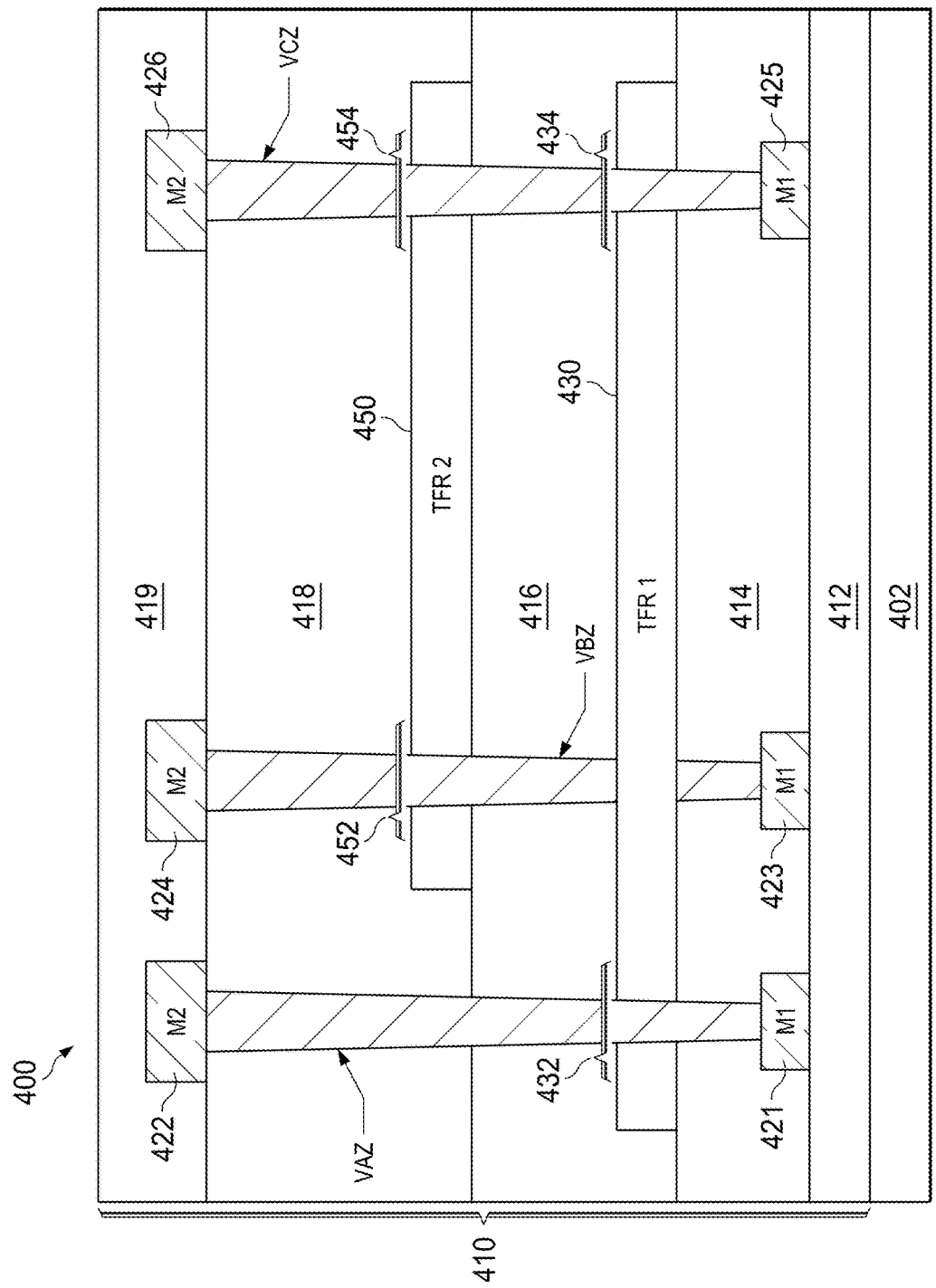
FIG. 4 shows a cross-sectional view of a device having a single TFR structure with multiple TFR layers, each of which includes punch-through vias according to an aspect of the present disclosure.

Referring to FIG. 4, the TFR structure 200 can be configured and arranged to form a single TFR structure 400 with multiple TFR layers (e.g., 430 and 450). The TFR structure 400 is formed within a device having a substrate 402 and a stack of dielectric layers 410. The stack of dielectric layers 410 can be formed by sequential depositions of a first dielectric layer 412, a second dielectric layer 414 on the first dielectric layer 412, a third dielectric layer 416 on the second dielectric layer 414, a fourth dielectric layer 418 on the third dielectric layer 416, and a fifth dielectric layer 419 on the fourth dielectric layer 419.

The TFR structure 400 includes structural features of the TFR structure 200. For the sake of conciseness, some of these features are not shown or described again in FIG. 4 though it is understood that the TFR structure 400 may nevertheless incorporate these features. The TFR structure 400 includes a first TFR layer 430 positioned above the substrate 402. Positioned between the first and second dielectric layers 414 and 416, the first TFR layer 430 may be formed after the first dielectric layer 414 and before the second dielectric layer 416. Positioned between the second and third dielectric layers 416, and 418, the second TFR layer 450 may be formed after the second dielectric layer 416 and before the third dielectric layer 418.

Figure 5:
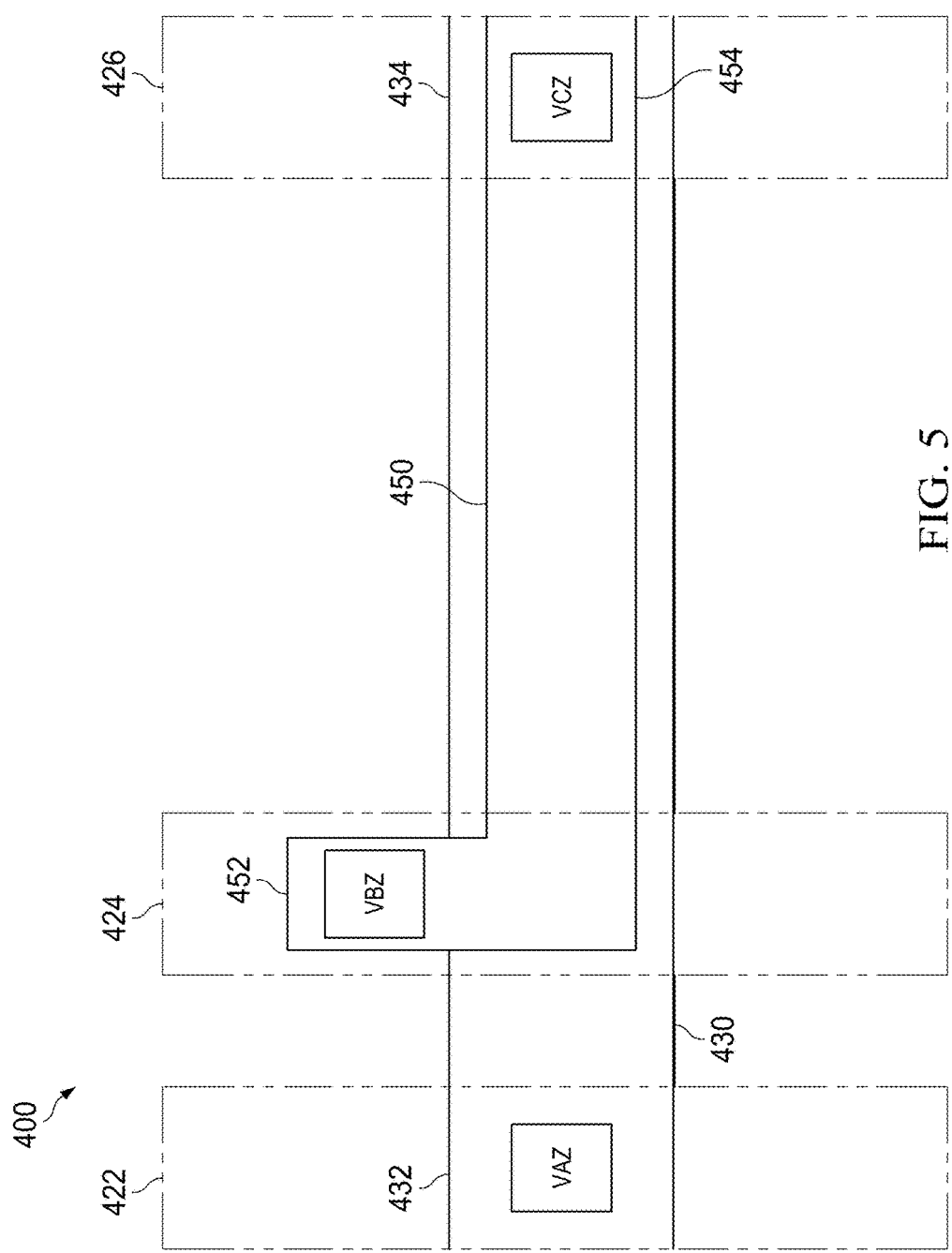
FIG. 5 shows a top view of the device as shown in FIG. 4 according to an aspect of the present disclosure.

The first and second TFR layers 430 and 450 each has similar characteristics as the TFR layer 230 as shown and described in FIG. 2A. The first and second TFR layers 430 and 450 are coupled in series to form a chain of resistors. To reduce die size, the second TFR layer 450 is arranged to at least partially overlap and coextend with the first TFR layer 430. As shown in FIG. 5, for example, the first and second TFR layers 430 and 450 coextend with, thereby overlapping, each other between the upper metal layers 424 and 426. Three punch-through (conductive) vias VAZ, VBZ, and VCZ are used to access different resistance segments of the resistor chain formed by the first and second TFR layers 430 and 450.

A first punch-through via VAZ extends from a first upper metal layer 422 to completely penetrate through a first terminal region 432 of the first TFR layer 430. The first punch-through via VAZ protrudes from a bottom surface of the first TFR layer 430 to reach a first etch stop (or landing pad) layer, such as a first lower metal layer 421. The first punch-through via VAZ is coupled to a sidewall of the first TFR layer 430 at or near the site of penetration.

A second punch-through via VBZ extends from a second upper metal layer 424 to completely penetrate through a first terminal region 452 of the second TFR layer 450. The second punch-through via VBZ protrudes from a bottom surface of the second TFR layer 450 to reach a second etch stop (or landing pad) layer, such as a second lower metal layer 423. The second punch-through via VBZ is coupled to a sidewall of the second TFR layer 450 at or near the site of penetration. As shown in FIG. 5, the second punch-through via VBZ is positioned out-of-plane from the first TFR layer 430, such that the second punch-through via VBZ does not cross path or penetrate the first TFR layer 430. Unlike the first punch-through via VAZ, the second punch-through via VBZ does not establish any direct ohmic contact with the first TFR layer 430.

A third punch-through via VCZ extends from a third upper metal layer 426 to completely penetrate through a second terminal region 454 of the second TFR layer 450, as well as a second terminal region 434 of the first TFR layer 430. The third punch-through via VCZ protrudes from the bottom surfaces of the second and first TFR layers 450 and 430 to reach a third etch stop (or landing pad) layer, such as the third lower metal layer 425. The third punch-through via VCZ serves as a connector connecting between the first and second TFR layers 430 and 450 as it establishes ohmic contacts with both the first and second TFR layers 430 and 450.

Together, the first and third punch-through vias VAZ and VCZ establish a conductive path through the first TFR layer 430. As such, the first and third upper metal layers 422 and 426 can be used for accessing the body resistance of the first TFR layer 430 between the first and second terminal regions 432 and 434. Likewise, the second and third punch-through vias VBZ and VCZ establish a conductive path through the second TFR layer 450. As such, the second and third upper metal layers 424 and 426 can be used for accessing the body resistance of the second TFR layer 450 between the first and second terminal regions 452 and 454. Furthermore, the first and second punch-through vias VAZ and VBZ establish a conductive path through the first TFR layer 430, the third punch-through via VCZ, and the second TFR layer 450. The first and second upper metal layers 422 and 424 can be used for accessing the aggregate body resistance of the first and second TFR layers 430 and 450. In this configuration, the TFR structure 400 can serve as a voltage divider, in which the first upper metal layer 422 is coupled to a high potential terminal (e.g., $V_H$), the second upper metal layer 424 is coupled to a low potential terminal (e.g., $V_L$), and the third upper metal layer 426 is configured to deliver a middle potential (e.g., $V_{Div}=(V_H-V_L)*R_{TFR2}/(R_{TFR1}+R_{TFR2})$) between the high and low potential.

Although the TFR structure 400 includes only two TFR layers, the present disclosure may apply to construct TFR structures with more than two TFR layers. For instance, the TFR structure 400 may include a third TFR layer above the second TFR layer, which can be accessed by the second punch-through via VBZ and an additional punch-through via. Advantageously, the punch-through vias helps improve the spatial efficiency of conventional resistor chains by allowing multiple resistance segments to be stacked vertically on top of one another.

Moreover, although FIG. 4 demonstrates that the multi-layer TFR structure 400 is configured as a serial resistor chain, the same multi-layer TFR architecture can be configured to form a capacitor. For instance, the TFR structure 400 may remove the third punch-through via VCZ, such that the first and second TFR layers 430 and 450 are not electrically coupled to each other. But instead, the first and second TFR layers 430 and 450 establish a capacitive coupling by overlapping each other with the second dielectric layer 416 positioned therebetween.

Figure 6:
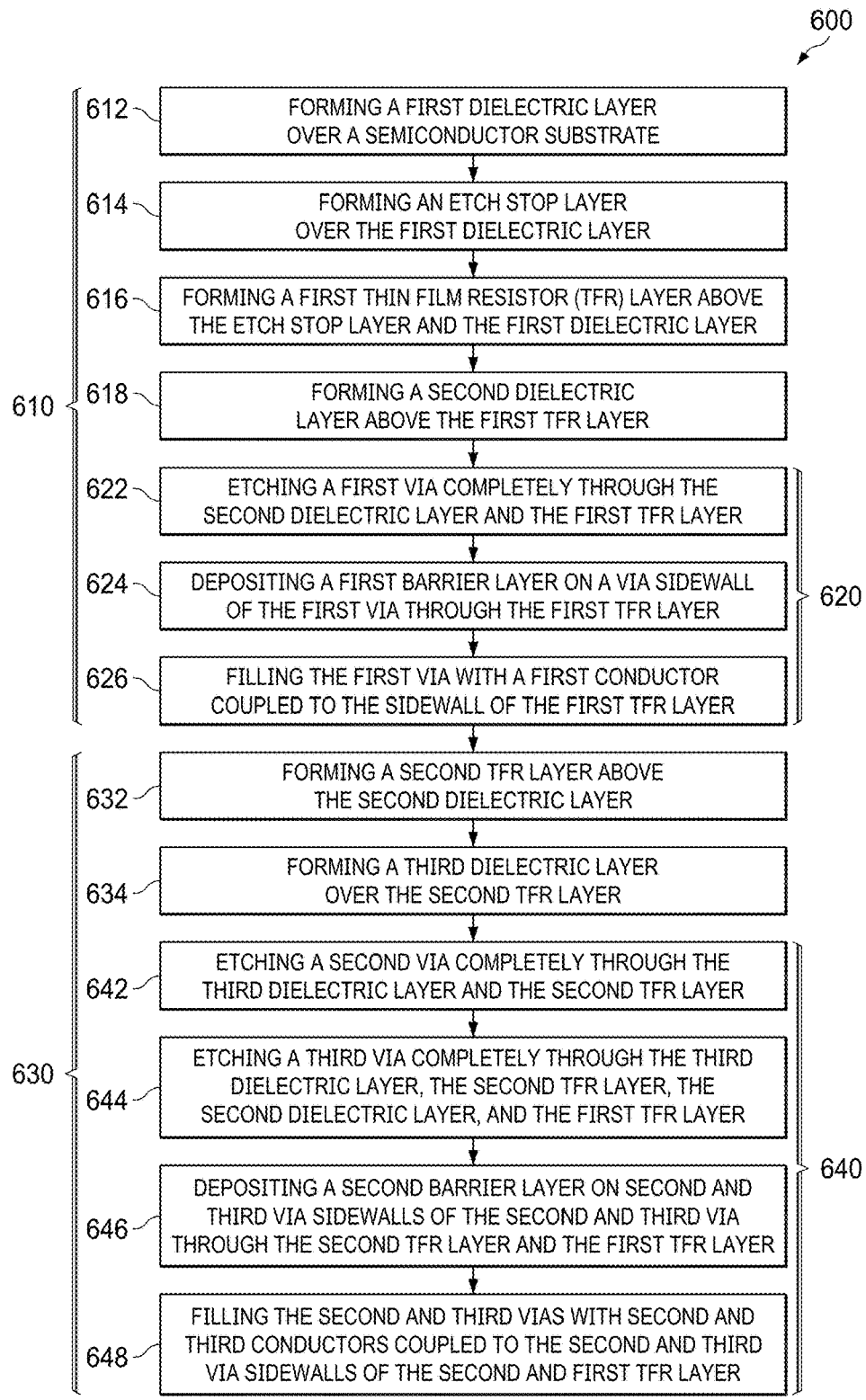
FIG. 6 shows a flow chart describing a process of manufacturing one or more TFR structures having punch-through vias according to an aspect of the present disclosure.

FIG. 6 shows a flow chart describing a method 600 of manufacturing one or more TFR structures (e.g., the TFR structures 200, 330, 350, and/or 400) having punch-through vias (e.g., VA, VB, VAX, VBX, VAY, VBY, VAZ, VBZ, VCZ) according to an aspect of the present disclosure. The method 600 includes a first process 610 and a second process 630. The first process 610 is used for manufacturing TFR structures with single TFR layers (e.g., TFR structures 200, 330, and/or 350), whereas the second process 630 is used in conjunction with the first process 610 for manufacturing TFR structures with multiple TFR layers (e.g., TFR structure 400). The first process 610 includes a first sequence 620 for forming one or more punch-through vias that penetrate a single TFR layer. The second process 630 includes a second sequence 640 for forming one or more punch-through vias that penetrate multiple TFR layers. Although FIG. 6 shows that the first sequence 620 is performed before, and separately from, the second sequence 640, the first sequence 620 may be integrated to the second process 630, such that these two processes are performed during the same process sequence.

The method 600 begins at step 612, which involves forming a first dielectric layer over a semiconductor substrate. The first dielectric layer can be the first dielectric layer 212, 312, or 412. Step 612 can be performed by a deposition of a silicon oxide material or any other suitable dielectric materials.

The method 600 proceeds to step 614, which involves forming an etch stop (or landing pad) layer over the first dielectric layer. The etch stop layer can be the lower metal layer M1 or the SiN layer as shown in FIG. 3. Step 614 can be performed by patterning a mask and depositing the etch stop layer into the openings defined by the mask, or alternately by depositing the etch stop layer first and then patterning and etching it using a photoresist process The method 600 proceeds to step 616, which involves forming a first thin film resistor (TFR) layer above the etch stop layer and the first dielectric layer. There may also be a chemical mechanical polish step before putting down the TFR layer for additional uniformity of processing. The first TFR layer can be the TFR layer 230, 332, 352, and 430. In one implementation, for example, step 616 can be performed by a physical vapor deposition of a power pressed sputtering target that includes a silicon (Si) material, a chromium (Cr) material, a carbon (C) material, and an oxygen material. As such, the first TFR layer may include an intermetallic mixture with an example composition (in relative atomic %) of $Si_xCr_yC_zO_w$, where x and y can range from 5% to 50%, whereas z and w can range from 0% to 50%. In another implementation, for example, step 616 can be performed by a physical vapor deposition of a power pressed sputtering target that includes a nickel (Ni) material, a chromium (Cr) material, a carbon (C) material, and an oxygen material. As such, the first TFR layer may include an intermetallic mixture with an example composition (in relative atomic %) of $Ni_xCr_yC_zO_w$, where x and y can range from 5% to 50%, whereas z and w can range from 0% to 50%. In yet another implementation, for example, step 616 can be performed by a deposition of polysilicon material. As such, the first TFR layer may include a polysilicon layer.

The method 600 proceeds to step 618, which involves forming a second dielectric layer above the first TFR layer. The second dielectric layer can be the dielectric layer 214, 316, and 416. Step 618 can be performed by a deposition of a silicon oxide material or any other suitable dielectric materials. Step 618 may include a chemical mechanical polishing process that evens the top surface of the second dielectric layer as the underlying first TFR layer may create a plateau during the deposition of the silicon oxide material.

The method 600 proceeds to the first sequence 620 for forming one or more conductive vias that penetrate through a single TFR layer formed during steps 612 to step 618. The first sequence 620 begins at step 622, which involves etching a first via trench completely through the second dielectric layer and the first TFR layer. Step 622 can be performed by patterning a mask to define openings that align with the terminal regions (e.g., 232 and/or 234) of the first TFR layer (e.g., 230), and by etching the underlying materials through the opening. In one implementation, for example, step 622 can be performed by a reactive ion etch. The etch time duration is predetermined such that it will be sufficient for the via trench to completely penetrate the first TFR layer. If and when step 614 is performed prior to step 622, the etching may be retarded and/or slowed down by the etch stop layer. That way, the via trench may reach the etch stop layer without completely penetrating the etch stop layer.

The first sequence 620 then proceeds to step 624, which involves depositing a first barrier layer on a via sidewall of the first via trench through the first TFR layer. The barrier layer (e.g., 262 and/or 266) may include a titanium layer covered by a titanium nitride layer. As shown in FIG. 2A, for example, the barrier layer may also cover the sidewalls of the dielectric layers above and below the TFR layer near the sites of penetration.

The first sequence 620 then proceeds to step 626, which involves filing the first via trench with a first conductor coupled to the sidewall of the first TFR layer. The first conductor may include a tungsten material, an aluminum material, and/or other materials having a conductivity that is sufficiently high for serving as a conductive via. If and when step 624 is performed, the first conductor is coupled to the sidewall of the first TFR layer through the barrier layer. Otherwise, the first conductor may establish direct ohmic contact with the sidewall of the TFR layer at or near the sites of penetration. Together, the first conductor and the via trench form a conductive via that punch through the terminal region of the first TFR layer.

The first sequence 620 may be performed at multiple terminal regions of one or more TFR layers of one or more TFR structures simultaneously. Because the first sequence 620 is not sensitive to different via trench depths, it can be used to form multiple conductive vias, each punching through a TFR layer occupying a different depth from the other TFR layers.

The method 600 can be implemented for forming conductive vias, each of which can punch through multiple layers of TFR within a single TFR structure (e.g., the TFR structure 400 at FIG. 4). In this implementation, the method 600 may skip the first sequence 620 after performing step 618. The method 600 then proceeds to step 632, which involves forming a second TFR layer above the second dielectric layer. The second TFR layer can be the TFR layer 450 as shown and described in FIG. 4. Step 632 can be performed under substantially the same process parameters as in step 616. In one implementation, for example, step 632 can be performed by a physical vapor deposition of a power pressed sputtering target that includes a silicon (Si) material, a chromium (Cr) material, a carbon (C) material, and an oxygen material. As such, the second TFR layer may include an intermetallic mixture with an example composition (in relative atomic %) of $Si_xCr_yC_zO_w$, where x and y can range from 5% to 50%, whereas z and w can range from 0% to 50%. In another implementation, for example, step 632 can be performed by a physical vapor deposition of a power pressed sputtering target that includes a nickel (Ni) material, a chromium (Cr) material, a carbon (C) material, and an oxygen material with an example composition (in relative atomic %) of $Ni_xCr_yC_zO_w$, where x and y can range from 5% to 50%, whereas z and w can range from 0% to 50%. $Cr_xO_y+Si_xO_y+Cr_xSi_y+Si_xC_y$ composition, where X ranges from 0 to 3, and Y ranges from 0 to 3. In yet another implementation, for example, step 632 can be performed by a deposition of polysilicon material. As such, the second TFR layer may include a polysilicon layer.

The method 600 then proceeds to step 634, which involves forming a third dielectric layer over the second TFR layer. The third dielectric layer can be the dielectric layer 418 as shown and described in FIG. 4. Step 634 can be performed by a deposition of a silicon oxide material or any other suitable dielectric materials.

The method 600 then proceeds to the second sequence 640 for forming one or more conductive vias that penetrate through one or more TFR layers, which are formed during steps 612 to step 618, as well as step 632 to step 634. The second sequence 640 begins at step 642, which involves etching a second via completely through the third dielectric layer and the second TFR layer. For example, the via trench for the second punch-through via VBZ as shown in FIG. 4 can be etched through the dielectric layer 418 and the second TFR layer 450. Moreover, step 622 from the first sequence 620 can be performed alongside with step 642 using the same mask. For example, the via trench for the first punch-through via VAZ as shown in FIG. 4 can be etched through the dielectric layers 418 and 416 and the first TFR layer 430. A single mask may define openings that align with the first terminal region 432 of the first TFR layer 230, as well as the first terminal region 452 of the second TFR layer 450. The single mask allows a single etch to remove the underlying materials from the first terminal regions 432 and 452 through these openings. In one implementation, for example, step 642 can be performed by a reactive ion etch process. The etch time duration is predetermined such that it will be sufficient for the via trench to completely penetrate the second TFR layer, and optionally the first TFR layer. If and when step 614 is performed prior to step 642, the etching may be retarded and/or slowed down by the etch stop layer. That way, the via trenches may reach the etch stop layer without completely penetrating the etch stop layer.

Moreover, step 644 may also be performed simultaneously, and with the same mask as, step 642. Step 644 involves etching a third via completely through the third dielectric layer, the second TFR layer, the second dielectric layer, and the first TFR layer. For example, the via trench for the third punch-through via VCZ as shown in FIG. 4 can be etched through the dielectric layer 418, the second TFR layer 450, the dielectric layer 416, and the first TFR layer 430. A single mask may define openings that align with the first terminal region 432 of the first TFR layer 230, the first terminal region 452 of the second TFR layer 450, as well as the second terminal regions 454 and 434 of the second and first TFR layers 450 and 430 respectively.

Advantageously, the single mask approach allows a single etch to form multiple via trenches through multiple TFR layers at different depths. The via trenches are adaptive to varying thicknesses of the TFR layers and varying thicknesses of the dielectric layers above and below the TFR layers. In one implementation, for example, step 644 can be performed by a reactive ion etch process. The etch time duration is predetermined such that it will be sufficient for the via trench to completely penetrate the second TFR layer and the first TFR layer. If and when step 614 is performed prior to step 644, the etching may be retarded and/or slowed down by the etch stop layer. That way, the via trenches may reach the etch stop layer without completely penetrating the etch stop layer.

Next, the second sequence 640 proceeds to step 646, which involves depositing a second barrier layer on second and third via sidewalls of the second and third via through the second TFR layer and the first TFR layer. Step 646 is similar to step 624, and thus step 646 can be performed alongside with step 624 after step 644.

Finally, the second sequence 640 proceeds to step 648, which involves filing the second and third vias with second and third conductors coupled to the second and third via sidewalls of the second and first TFR layer. For example, the third punch through via VCZ can be formed by filling a conductive material within the respective via trench as shown in FIG. 4. The via trench conductor is coupled to the sidewalls of the second TFR layer 450 and the first TFR layer 430 at or near the sites of penetration. Step 648 is similar to step 626, and thus step 648 can be performed alongside with step 626 after step 644 if step 646 is omitted, or after step 646 if step 646 is performed. The via trench conductor may include a tungsten material, an aluminum material, and/or other materials having a conductivity that is sufficiently high for serving as a conductive via. If and when step 646 is performed, the conductors are coupled to the sidewall(s) of the respective TFR layer(s) through the barrier layer. Otherwise, the conductors may establish direct ohmic contact with the sidewall(s) of the respective TFR layer(s) at or near the sites of penetration. Together, the conductors and the via trenches form conductive vias that punch through the respective terminal regions of the respective TFR layers.

FIGS. 7A-7E show cross-sectional views of a device as shown in FIGS. 4 and 5 during a process of manufacturing thereof with slight variations from the method 600 as shown in FIG. 6. In particular, the process as shown in FIGS. 7A-7E has integrated the first sequence 620 into the second sequence 640. With this integration, the process as shown in FIGS. 7A-7E streamlines the etch process such that a single mask is used for etching all the punch-through via trenches.

Figure 7A:
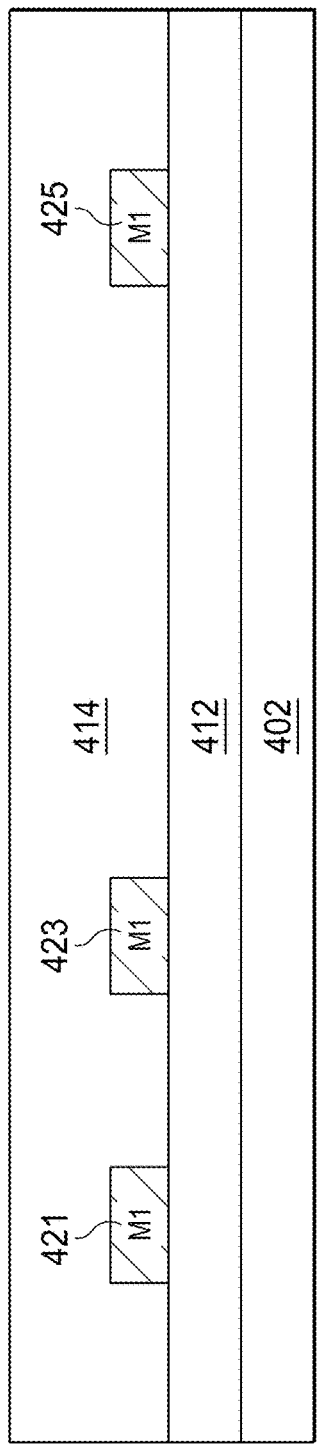
FIGS. 7A-7E show cross-sectional views a process of manufacturing the device as shown in FIGS. 4 and 5 with slight variations from the flow chart as shown in FIG. 6.

FIG. 7A shows the beginning of the manufacturing process, in which steps 612 and 614 of the method 600 have been performed. A first dielectric layer 412 is deposited on the semiconductor substrate 402. A lower metal layer including M1 metal layers 421, 423, and 425 are formed on the first dielectric layer 412. The lower metal layer may serve as an interconnect layer coupled to an upper metal layer. The lower metal layer may also serve as an etch stop layer or a landing pad layer for receiving punch-through vias coupled to one or more TFR layers. A second dielectric layer 414 is deposited on the lower metal layer and then polished by a chemical mechanical polish process. In some implementations however, the polish process can be omitted.

Figure 7B:
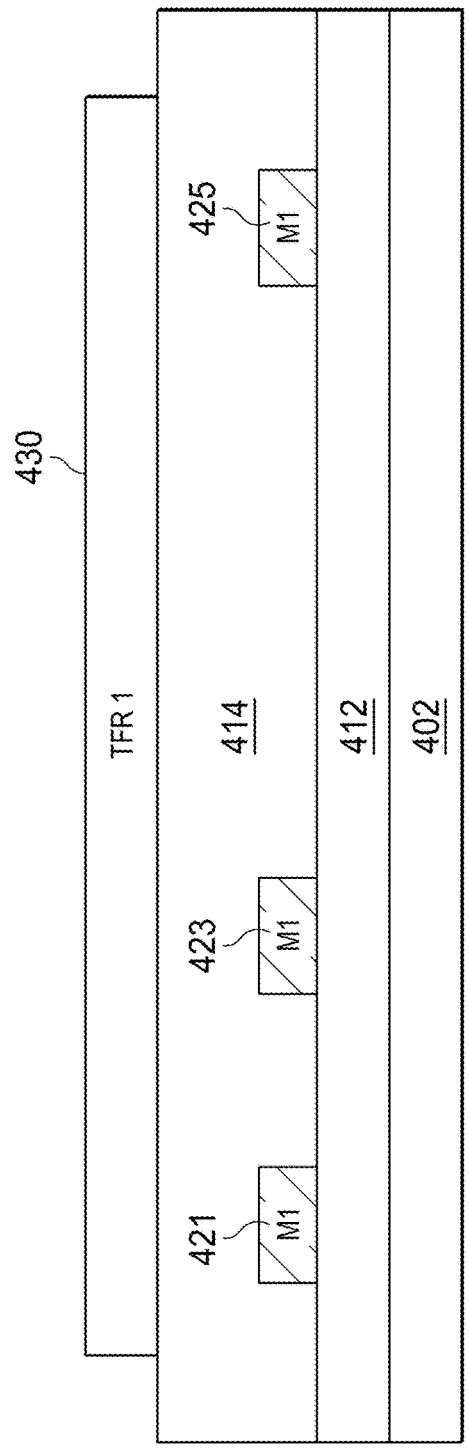
Figure 7C:
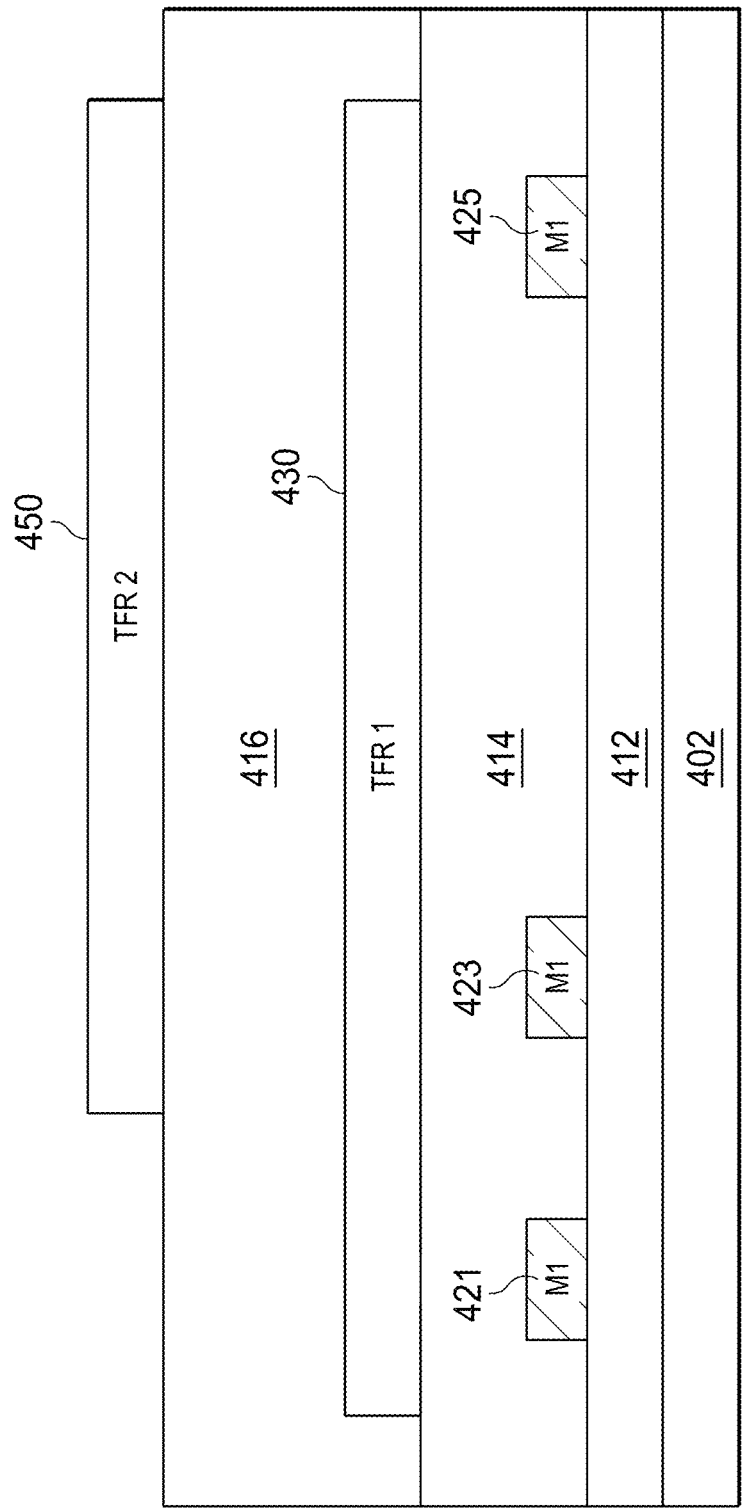

The process then proceeds to FIG. 7B, in which step 616 from the method 600 is performed. In particular, a first TFR layer 430 is formed on the second dielectric layer 614. Next, the process proceeds to FIG. 7C, in which steps 618 and 632 are performed sequentially. In particular, a third dielectric layer 416 is deposited on the first TFR layer 630. After the third dielectric layer 416 is polished by a chemical mechanical polish process, a second TFR layer 450 is formed on the third dielectric layer 416.

Figure 7D:
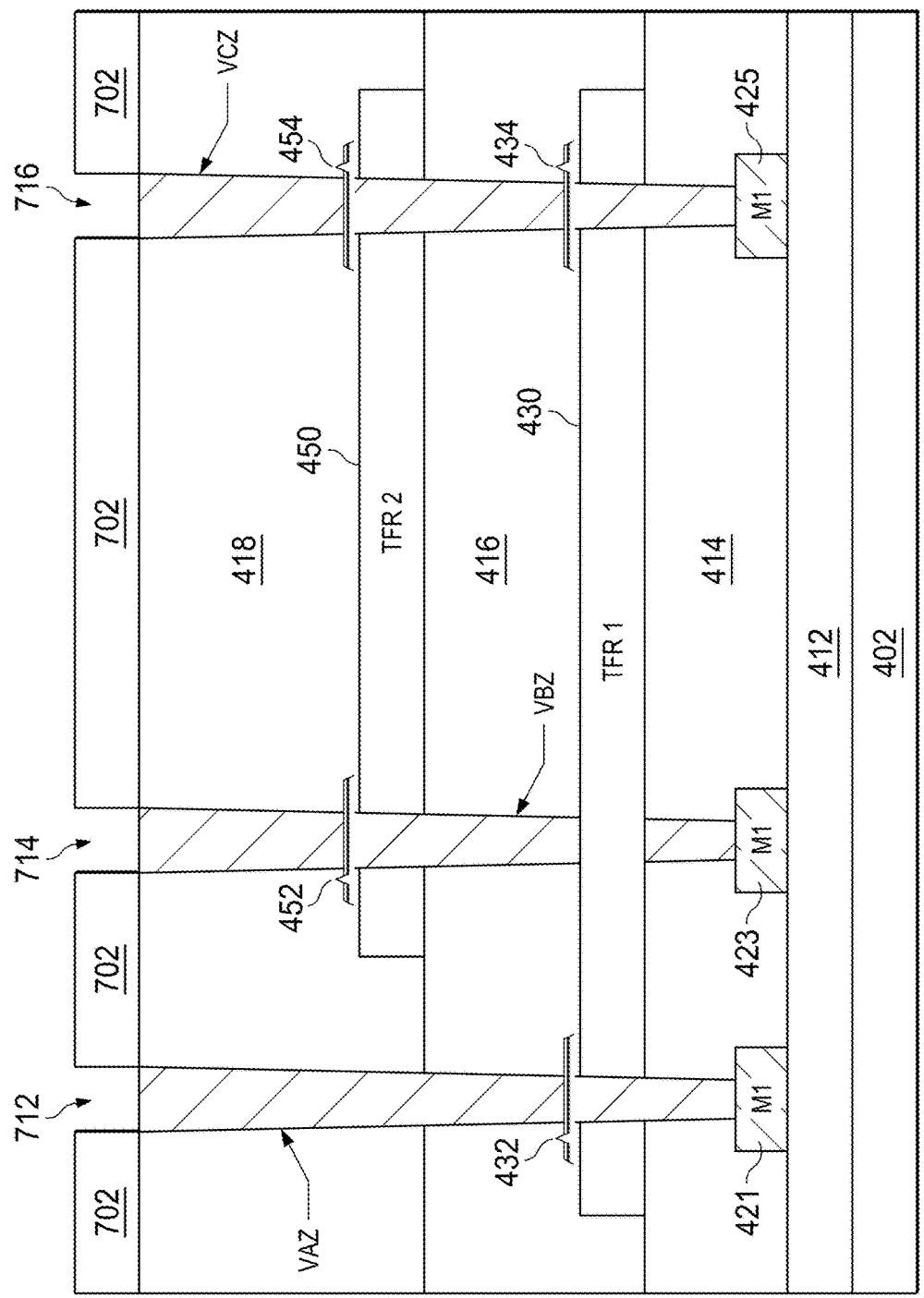

The process then proceeds to FIG. 7D, in which step 634 of the method 600 is first performed. More specifically, a fourth dielectric layer 418 is deposited on the second TFR layer 450. After the fourth dielectric layer 418 is polished by a chemical mechanical polish process, a single mask 702 is deposited on the fourth dielectric layer 418.

As shown in FIG. 7D, steps 622, 642, and 644 of the process 600 are performed simultaneously because the mask 702 is patterned with openings that align with the respective terminal regions of the respective TFR layers. In particular, the mask 702 is patterned with at least: (1) a first opening 712 that aligns with the first terminal region 432 of the first TFR layer 430, (2) a second opening 714 that aligns with the first terminal region 452 of the second TFR layer 450, and (3) a third opening 716 that aligns with the second terminal regions 454 and 434 of the second and first TFR layers 450 and 430 respectively. During a single etch process, via trenches for punch-through vias VAZ, VBZ, and VCZ can be etched simultaneously through the dielectric layers 418, 416, and 414, and through the second and first TFR layers 450 and 430. The single etch process may be retarded, slowed down, or terminated by the lower metal layers 421, 423, and 425.

After the single etch process, steps 624 and 646 of the method 600 can be performed to deposit a barrier layer onto the sidewalls of these via trenches. Next, steps 626 and 648 of the method 600 can be performed to fill the via trenches with a conductive material. At this point, the first, second, and third punch-through (conductive) vias VAZ, VBZ, and VCZ are formed.

Figure 7E:
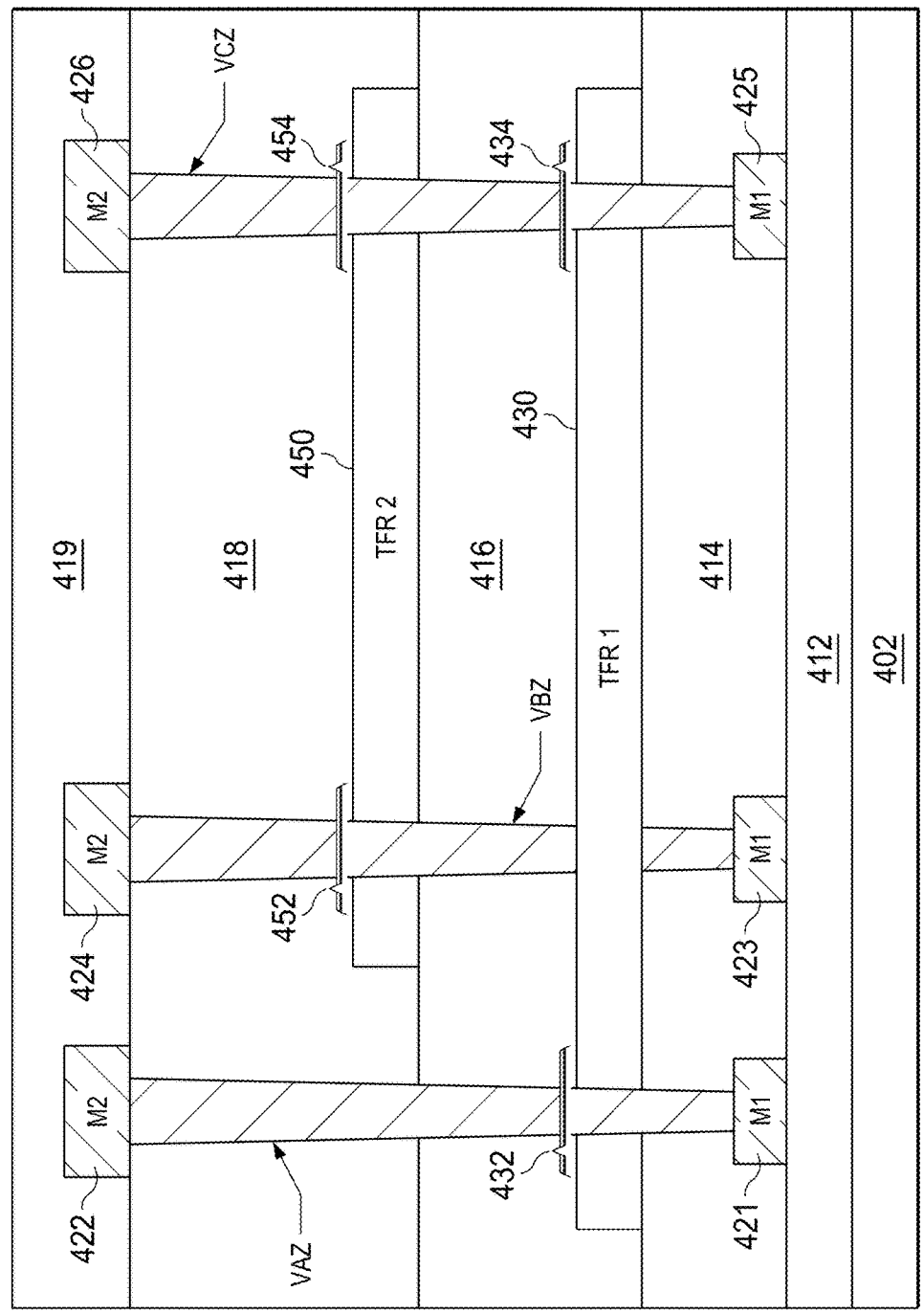

Finally, the process proceeds to FIG. 7E, in which an upper metal layer including M2 metal layers 422, 424, and 426 are formed on the fourth dielectric layer 418. The M2 metal layers 422, 424, and 426 are each coupled to a respective punch-through via, such that they each serves as an access point for accessing a terminal region of one or more TFR layers. After the upper metal layer is formed, a fifth dielectric layer 419 is deposited on the fourth dielectric layer 418 followed by a chemical mechanical polish process.

The fabrication process as depicted in FIGS. 7A-7E provides several advantages over the manufacturing of the device 100 as shown in FIG. 1. First, the disclosed process adopts a single-mask approach to form conductive vias for accessing TFR layers without having any resistor heads and the overhead resistance associated therewith. Second, by removing the variability in head resistance, the disclosed process also eliminates the need for matching head resistance among several TFR structures occupying different depth levels within a semiconductor device. Third, the disclosed process eliminates additional process steps for forming additional protective hard mask and/or etch stop layer after one or more TFR layers are formed. Fourth, by adopting a non-selective via etch process, the disclosed process eliminates the need to tune the via etch for the purpose of making good ohmic contacts between the conductive vias and the TFR layers.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

Furthermore, terms of relativity, such as "about," "approximately," "substantially," "near," "within a proximity," "sufficient . . . to," "maximum," and "minimum," as applied to features of an integrated circuit and/or a semiconductor device can be understood with respect to the fabrication tolerances of a particular process for fabricating the integrated circuit and/or the semiconductor device. In addition, these terms of relativity can be understood within a framework for performing one or more functions by the integrated circuit and/or the semiconductor device.

More specifically, for example, the terms "substantially the same," "substantially equals," and "approximately the same" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A device, comprising:
    a substrate;
    a thin film resistor (TFR) layer above the substrate;
    a dielectric layer above the TFR layer; and
    a conductive via completely through the dielectric layer and completely through the TFR layer, the conductive via coupled to a sidewall of the TFR layer.

2. The device of claim 1, wherein:
    the TFR layer includes:
        a first terminal region positioned near a first end of the TFR layer; and
        a second terminal region positioned near a second end of the TFR layer; and
    the conductive via includes:
        a first conductive via completely through the first terminal region; and
        a second conductive via completely through the second terminal region.

3. The device of claim 1, further comprising:
    a metal pad below the TFR layer,
    wherein the conductive via reaches the metal pad without completely penetrating the metal pad.

4. The device of claim 1, further comprising:
    an etch stop layer under the TFR layer,
    wherein the conductive via reaches the etch stop layer without completely penetrating the etch stop layer.

5. The device of claim 1, wherein the TFR layer includes a silicon chromium (SiCr) intermetallic mixture.

6. The device of claim 1, wherein the TFR layer includes a nickel chromium (NiCr) intermetallic mixture.

7. The device of claim 1, wherein:
    the TFR layer includes:
        a first TFR layer above the substrate; and
        a second TFR layer above the first TFR layer, and at least partially overlapping and coextending with the first TFR layer;
    the dielectric layer includes:
        a first dielectric layer between the first TFR layer and the second TFR layer; and
        a second dielectric layer above the second TFR layer;
    the conductive via completely through the second dielectric layer, the second TFR layer, the first dielectric layer, and the first TRF layer.

* * * * *